US009400197B2

(12) United States Patent
Najafi et al.

(10) Patent No.: US 9,400,197 B2
(45) Date of Patent: Jul. 26, 2016

(54) FLUID FLOW SENSOR (71) Applicant: The Regents of The University of Michigan, Ann Arbor, MI (US)

(72) Inventors: Khalil Najafi, Ann Arbor, MI (US); Mahdi Sadeghi, Ann Arbor, MI (US); Rebecca L. Peterson, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 798 days.

(21) Appl. No.: 13/623,084

(22) Filed: Sep. 19, 2012

(65) Prior Publication Data

US 2015/0253169 A1    Sep. 10, 2015

Related U.S. Application Data (60) Provisional application No. 61/536,271, filed on Sep. 19, 2011.

(51) Int. Cl.
*G01F 1/69*  (2006.01)
*B23K 20/00* (2006.01)

(52) U.S. Cl.
CPC ............... *G01F 1/69* (2013.01); *B23K 20/004* (2013.01)

(58) Field of Classification Search
CPC ......... G01F 1/684; G01F 1/6845; G01F 1/68; G01F 1/688; G01F 1/6888; G01P 5/12; G01P 5/02
USPC ...................................................... 73/204.14
See application file for complete search history.

(56) References Cited

U.S. PATENT DOCUMENTS

| 4,523,461 | A | * | 6/1985 | Watkins | G01P 5/12 73/204.27 |
|---|---|---|---|---|---|
| 4,538,457 | A | * | 9/1985 | Gneiss | G01F 1/684 338/25 |
| 4,604,895 | A | * | 8/1986 | Watkins | G01F 1/684 73/204.27 |
| 5,460,039 | A | * | 10/1995 | Cutler | G01F 1/684 73/195 |
| 6,840,116 | B2 | * | 1/2005 | Higgins | A61B 5/0878 128/200.24 |

(Continued)

OTHER PUBLICATIONS

Lomas, C. G., 1986: Fundamentals of Hot Wire Anemometry, pp. 63-64, Cambridge University.

(Continued)

*Primary Examiner* — Freddie Kirkland, III
(74) *Attorney, Agent, or Firm* — Reising Ethington P.C.

(57) ABSTRACT

A fluid flow sensor that utilizes hot-wire anemometry and is a small, light weight, cost effective, easily manufactureable, and low power consuming device. The fluid flow sensor operates by exposing a hot wire loop to a fluid stream such that the amount of heat lost to fluid convection is a function of one or more fluid-related parameters (e.g., fluid speed, fluid type, fluid density, etc.). The heat loss affects the resistance in the wire loop, which can then be used to estimate the fluid speed or other fluid-related parameter. According to an exemplary embodiment, the fluid flow sensor includes one or more wire loops that are made from pre-formed wires and are wire bonded, micro-welded or otherwise non-monolithically attached to a substrate that may or may not include embedded sensor circuitry.

26 Claims, 12 Drawing Sheets

(56) References Cited

U.S. PATENT DOCUMENTS

| | | | | |
|---|---|---|---|---|
| 6,923,054 | B2* | 8/2005 | Liu | G01F 1/6845 73/204.27 |
| 7,360,416 | B2* | 4/2008 | Manaka | G01F 1/684 73/204.26 |
| 7,574,910 | B2* | 8/2009 | Manaka | G01N 25/66 73/204.26 |
| 7,644,624 | B2* | 1/2010 | Liu | G01F 1/28 73/756 |
| 7,963,162 | B2* | 6/2011 | Muziol | G01F 1/692 73/204.26 |
| 8,109,130 | B2* | 2/2012 | Dimeo, Jr. | G01N 27/128 422/83 |
| 8,650,947 | B2* | 2/2014 | Lopez | G01F 1/6842 73/204.27 |
| 8,744,544 | B2* | 6/2014 | Najafi | A61B 5/0031 600/345 |
| 8,800,379 | B2* | 8/2014 | Moro | G01F 1/68 29/592 |
| 2005/0109102 | A1* | 5/2005 | Liu | G01F 1/6845 73/204.27 |
| 2007/0113644 | A1* | 5/2007 | Manaka | G01F 1/684 73/204.26 |
| 2008/0034861 | A1* | 2/2008 | Bognar | G01P 5/10 73/204.19 |
| 2009/0105557 | A1* | 4/2009 | Najafi | A61B 5/0031 600/301 |
| 2009/0305427 | A1* | 12/2009 | Dimeo, Jr. | G01N 27/128 436/106 |

OTHER PUBLICATIONS

Ebefors, T., Kalvesten, E., Stemme, G., 1998: "Three Dimensional Silicon Triple-hot-wire Anemometer Based on Polyimide Joints" Proc. Micro Electro Mechanical Systems (MEMS98), Jan. 1998, pp. 93-98, Anaheim, CA.

Chen, N., Tucker, C.J., Engel, M., Yang, Y., Pandya, S. and Liu, C., 2007: "Design and Characterization of Artificial Haircell Sensor for Flow Sensing With Ultrahigh Velocity and Angular Sensitivity", J. Micro Electro Mechanical Systems (MEMS), 16, pp. 999-1014.

Al-Garni, A.M., 2007: "Low Speed Calibration of Hot-wire Anemometers" Flow Measurement and Instrumentation 18, pp. 95-98, Published by Elsevier Ltd.

Jaganatharaja, R.K., Bruinink, C.M., Hagedoorn, B.M., Kolster, M.L., Lammerink, T.S.J., Wiegerink, R.J. and Krijnen, G.J.M., 2009: "Highly-Sensitive, Biomimetic Hair Sensor Arrays for Sensing Low-Frequency Air Flows" Proc. Solid-State Sensors, Acutators and Microsystems (TRANDUCERS 2009), Jun. 2009, pp. 1541-1544, Denver CO.

Birkmeyer P., Peterson K. and Fearing, R., 2009: "DASH: A Dynamic 16g Hexapedal Robot" Proc. IEEE/RSJ International Conference on Intelligent Robots and Systems, pp. 2683-2689.

* cited by examiner

FLUID FLOW SENSOR

CROSS-REFERENCE TO RELATED APPLICATION

This application claims the benefit of U.S. Provisional Ser. No. 61/536,271 filed on Sep. 19, 2011, the entire contents of which are incorporated herein.

GOVERNMENT LICENSE RIGHTS

This invention was made with government support under W911NF-08-2-0004 awarded by the U. S. Army Research Office. The government has certain rights in the invention.

TECHNICAL FIELD

The invention relates generally to fluid flow sensors and, more particularly, to fluid flow sensors that utilize hot-wire anemometry.

BACKGROUND

A variety of different types of hot-wire anemometers have been produced and sold, including ones that use a thin wire suspended between two prongs (hereafter referred to as a "wire-type") and ones that have a thin film deposited on a substrate (hereafter referred to as a "film-type").

In the case of wire-type anemometers, the device is typically configured as an elongated probe or wand and includes a thin wire that acts as the sensing element and is stretched between two prongs mounted to the end of a probe body. The prongs hold the tightly stretched wire therebetween so that the wire can be exposed to the fluid being measured, which is typically a gas or a non-conducting liquid. The small wire diameter can make the devices expensive to manufacture and fragile to handle.

Film-type anemometers, on the other hand, typically use a thin metal film directly deposited on an electrically insulated substrate. The thin metal film acts as the sensing element and is usually monolithically formed on the substrate using micro-fabrication techniques. While film-type anemometers can be more robust and durable than some wire-type anemometers, they may not perform well in some environments such as in certain open and unenclosed spaces, or they may require a large amount of area on the substrate.

SUMMARY

According to one aspect, there is provided a fluid flow sensor, comprising: a substrate, at least one wire connection mounted on the substrate, and at least one wire loop attached to the substrate via the wire connection. The wire loop is made from a pre-formed wire that is attached to the substrate as a sensing element.

According to another aspect, there is provided a fluid flow sensor, comprising: a substrate having embedded sensor circuitry, at least one wire connection mounted on the substrate, and at least one wire loop wire bonded to the substrate via the wire connection. The wire loop is a pre-formed bond wire that is wire bonded to the substrate so that it extends away from the substrate and acts as a sensing element.

According to another aspect, there is provided a method of manufacturing a fluid flow sensor. The method may comprise the steps of: (a) providing a substrate, (b) providing at least one pre-formed wire, and (c) attaching the pre-formed wire to the substrate using a non-monolithic forming process, wherein the pre-formed wire is attached as a wire loop that acts as a sensor element.

BRIEF DESCRIPTION OF THE DRAWINGS

Preferred exemplary embodiments will hereinafter be described in conjunction with the appended drawings, wherein like designations denote like elements, and wherein.

DETAILED DESCRIPTION OF THE ILLUSTRATED EMBODIMENTS

Figure 1:
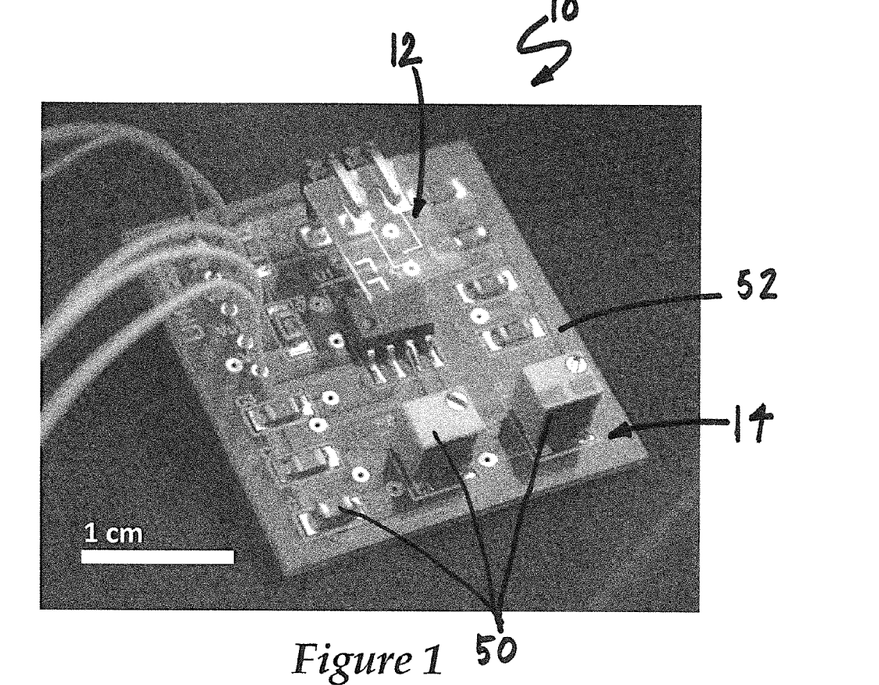
FIG. 1 is a perspective view of an exemplary sensor assembly that includes a fluid flow sensor.
Figure 2:
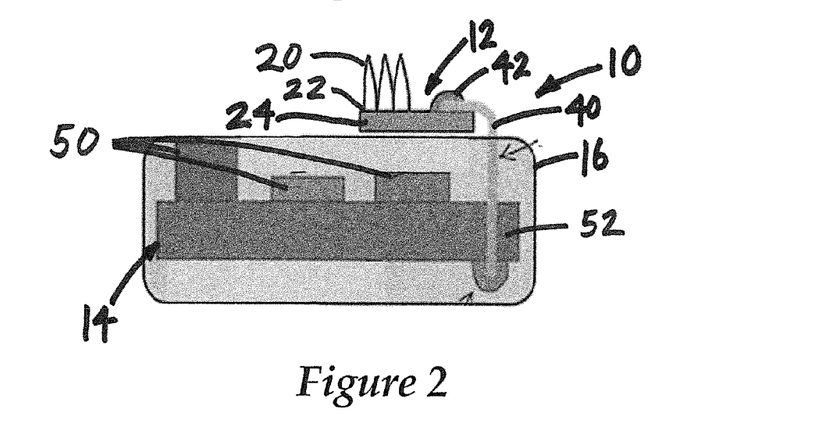
FIG. 2 is a schematic cross-sectional view of the sensor assembly shown in FIG. 1.

The fluid flow sensor described herein utilizes hot-wire anemometry and may be a small, light weight, cost effective, easily manufactureable, and low power consuming sensor that takes accurate fluid flow readings even during low flow rates. An exemplary fluid flow sensor is shown in FIGS. 1 and 2 in the context of a larger sensor assembly 10, which includes fluid flow sensor 12, sensor circuitry 14, and a housing 16. It should be appreciated that fluid flow sensor 12 may be used in any number of different sensor applications and is not limited to the exemplary assembly shown in FIGS. 1 and 2, which are only meant to illustrate one possible application of the fluid flow sensor. Fluid flow sensor 12 may, for example, be used in applications such as: unmanned air and ground vehicles (e.g., robotic crawlers, police and military robots, unmanned aerial drones, etc.), weather applications (e.g., wind gust monitors), navigational applications, industrial applications (e.g., HVAC monitors), scientific and research applications (e.g., wind tunnel monitors in the aerospace industry), medical applications (e.g., respirator and anesthesiology flow rate monitors), consumer applications (e.g., bicycle or running speed monitors), and more.

According to the exemplary sensor assembly 10 shown in FIGS. 1 and 2, fluid flow sensor 12 is maintained in an elevated state above sensor circuitry 14 so that the fluid flow sensor is exposed to a fluid stream of some type and can measure one or more parameters related to fluid flow. Typically, fluid flow sensor 12 is an air flow sensor, but this is not necessary as the sensor may be used with other gases, as well as liquids. Sensor 12 is sometimes referred to as a "hot-wire anemometer" and operates by exposing a hot wire (e.g., one maintained at a constant temperature or provided with a constant current) to a stream of air or other fluid. The amount of heat that is lost to fluid convection is a function of one or more fluid-related parameters, such as fluid speed, fluid flow, fluid type, fluid density, etc., and the heat loss affects the resistance in the sensor. The change in resistance can then be used to estimate the fluid speed or other fluid-related parameter. In FIGS. 1 and 2, fluid flow sensor 12 is maintained or supported in a suspended position above sensor circuitry 14 and housing 16 by a rigid connection 40. The rigid connection both mechanically supports the fluid flow sensor and electrically connects the fluid flow sensor with the sensor circuitry so that readings from the sensor can be provided to the circuitry for processing, analysis, etc. In order to attach rigid connection 40 with substrate 24, a solder pad 42 is used.

Sensor circuitry 14 is electrically connected to fluid flow sensor 12 and may analyze, evaluate and/or otherwise processes the sensor output. Generally speaking, the resistance of the sensor element in fluid flow sensor 12 is proportionally related to its temperature, which in turn is affected by the amount of fluid flow past the sensor element. Sensor circuitry 14 may include any number of known circuit arrangements, including the exemplary circuits shown in FIGS. 14 and 15, and according to one embodiment includes one or more circuit elements 50 mounted on a printed circuit board (PCB) or embedded within an integrated circuit (IC) 52. It can be preferable for PCB or IC 52 to be as small and compact as possible, for instance, width and length dimensions that are each from about 0.5 mm-50 mm and a total weight, without wire connections, from about 1 mg to 5 grams. These are only examples of potential dimensions and weight, as others are certainly possible. It is not necessary for the sensor circuitry to reside on PCB or IC 52, as any combination of this circuitry could instead reside on substrate 24 which is a component of fluid flow sensor 12. Proper thermal insulation and isolation should be taken into account to ensure that heat from the sensor circuitry does not affect the readings of the fluid flow sensor, or vice-versa.

Housing 16 is an enclosure that surrounds sensor circuitry 14 and, depending on the particular application, may protect the circuit from contaminants, thermally isolate fluid flow sensor 12 from the circuitry, and/or provide other functionality to sensor assembly 10. Housing 16 may be made from rigid or flexible material. In one example, housing 16 is made from a flexible, thermally-insulating plastic material that can be bent around sensor circuitry 14 and conform to its shape. In another example, housing 16 is made from a rigid plastic or other material that can thermally decouple sensor circuitry 14 from fluid flow sensor 12. It is possible for the space or volume within housing 16 to be filled with a potting or other type of material commonly used with such circuits, but this is certainly not necessary. With reference to FIG. 2, an additional thermal insulation layer could be inserted between the top of housing 16 and the bottom of substrate 24 of the fluid flow sensor.

Figure 3:
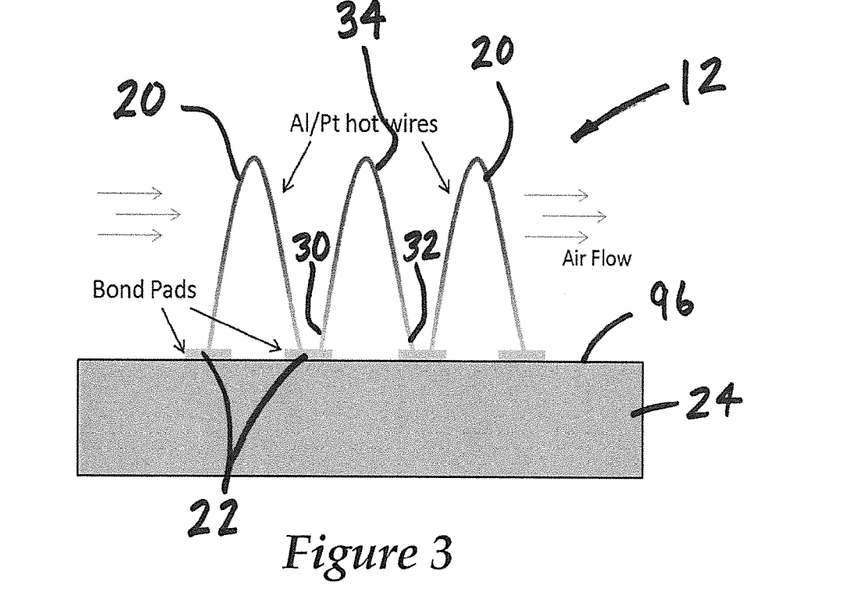
FIG. 3 is an enlarged, schematic cross-sectional view of an exemplary fluid flow sensor, such as the one shown in FIGS. 1 and 2.

Turning now to the exemplary embodiment of FIG. 3, fluid flow sensor 12 includes one or more wire loops 20, wire connections 22, and a substrate 24, where the wire loops are attached to the substrate using wire bonding, wire micro-welding or some other suitable attachment technique. Attaching wire loops 20 to substrate 24 with standard wire bonding equipment, such as the type routinely used in integrated circuit (IC) packaging, makes the manufacturing process simple, inexpensive, readily available and IC-compatible. In addition, since wire bonding is a post process step, there is generally no overhead expense to chip fabrication costs as the fluid flow sensor is formed during the mandatory IC packaging process. Fluid flow sensor 12 may be a micro-scale device that is operated as a constant temperature anemometer (CTA), a constant current anemometer (CCA), or according to some other suitable mode.

Wire loops 20 are attached to substrate 24 as sensing elements so that they can be exposed to a fluid stream, and may be made according to a number of different embodiments. For example, wire loops 20 may be fabricated from one of any number of different wire materials, including platinum (Pt), aluminum (Al), gold (Au), tungsten (W), iridium (Ir), copper (Cu), chromium (Cr), silver (Ag), paladium (Pd), silicon (Si), and/or alloys thereof. It is also possible for wire loops 20 to be coated with a protective coating layer so they can be used in harsh or corrosive environments, or with a chemically-sensitive coating layer that causes a change in the resistance, inductance and/or some other property of the wire when exposed to certain gases or chemicals. The term "wire material," as used herein, refers to both the underlying base material of the wire, as well as a coating layer, if one is present. It may be desirable to provide a fluid flow sensor where different wire loops 20 are made from different wire materials, as certain wire materials could be tailored to sense certain fluid flow parameters. The gauge and length of wire loops 20 can also vary depending on the particular sensor and application in which they are used and can alter the performance of the fluid flow sensor in terms of time response, dynamic range, power consumption, and sensitivity, to name a few. In some instances it is suitable for wire loops 20 to be made of wire having a diameter from about 1 µm-500 µm and a length from about 0.5 mm to 200 mm. According to one exemplary embodiment, each of the wire loops 20 is designed for use in a "wire bonding" process, is made from platinum (Pt), aluminum (Al), or an alloy thereof, has a diameter from about 15 µm-20 µm, and has a length from about 0.5 mm-1.5 mm. Other wire loop materials, dimensions, configurations, etc. may be used instead, particularly if the fluid flow sensor is to be used in a rugged gas flow (i.e., a gas flow with particulates) or a liquid flow, as is appreciated by those skilled in the art.

Each wire loop 20 may be wire bonded, micro-welded or otherwise attached to substrate 24. As explained above, the use of wire bonding techniques to attach the ends of wire loops 20 to substrate 24 may provide a number of advantages, particularly in terms of manufacturability and cost. For those embodiments where wire bonding is used, each wire loop 20 is preferably made from a "bond wire" which, as used herein, refers to any thin wire, ribbon, tape, or other interconnection that is connected to substrate 24 according to a wire bonding process. Wire bonding is used extensively throughout the semiconductor industry to assemble semiconductor packages and is generally deemed to be one of the most cost-effective and flexible techniques for connecting integrated circuits (ICs) to their packages, ICs to printed circuit boards (PCBs), or ICs to each other. Some non-limiting examples of wire bonding techniques that may be used to attach wire loops 20 to substrate 24 and/or to attach the wire loops to one another may include: ball bonding, wedge bonding, thermosonic bonding, ultrasonic bonding and stitch bonding, to cite a few possibilities. Those skilled in the art will appreciate that wire bonding, micro-welding or otherwise attaching wire loop 20 to substrate 24—where the wire loop is already provided in wire, ribbon or tape form before it is attached to the substrate—is different than depositing a thin metal film directly on the substrate during a semiconductor fabrication process, as in the case of film-type anemometers. In the former case, the wire loop is a "pre-formed wire," even if its three-dimensional shape is altered during or after the attachment process; in the latter case, the thin metal film is a "monolithically-formed film" and does not constitute a pre-formed wire, as that term is used herein. Another possible configuration is for one or more of the wire loops 20 to be directly attached to the PCB or IC 52, instead of substrate 24.

Figure 4:
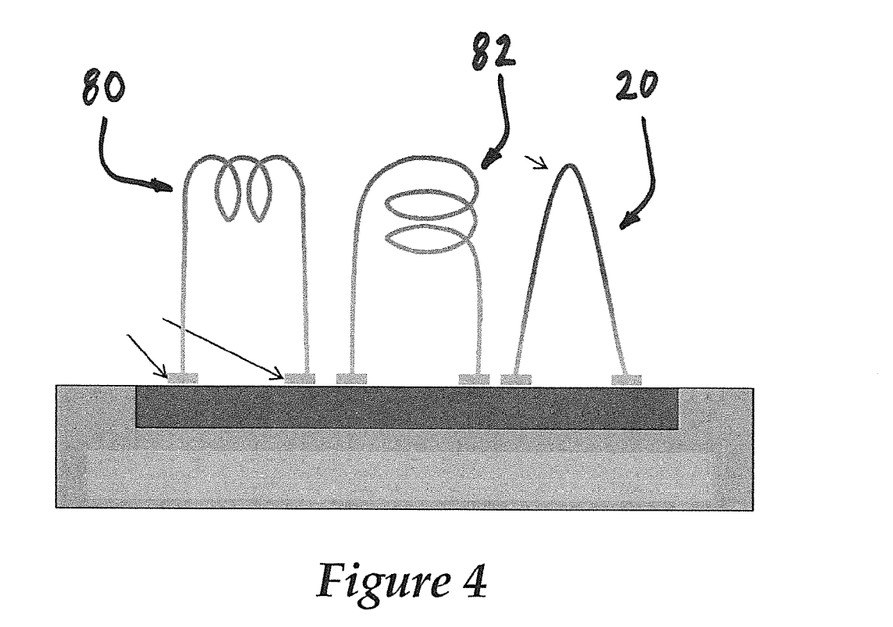
FIGS. 4 and 5 are enlarged, schematic cross-sectional views of different wire loop embodiments that may be used with a fluid flow sensor, such as the one shown in FIG. 3.
Figure 5:
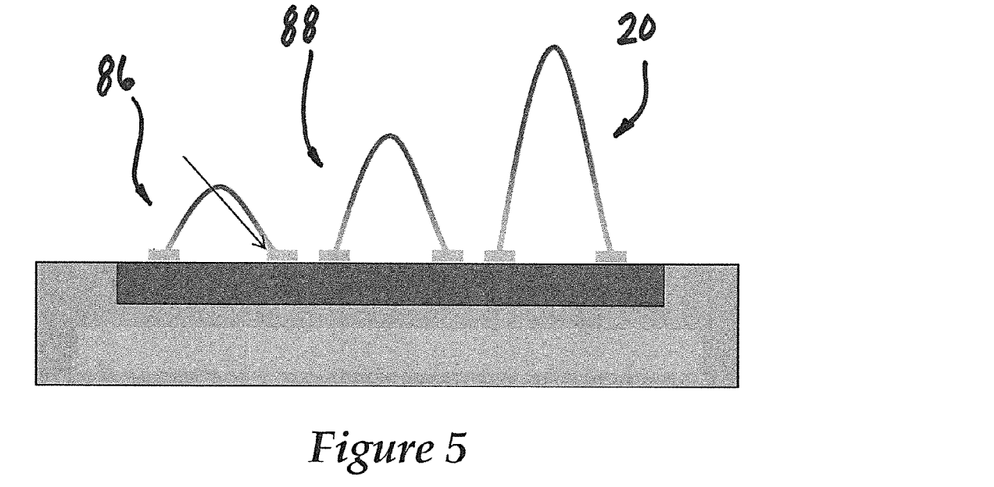

Each wire loop 20 may include a first end 30, a second end 32 and an intervening body portion 34 that extends between the two ends. In the example of FIG. 3, both the first and second ends 30 and 32 are attached to substrate 24 via wire connections 22, and the intervening body portion 34 is arranged as a single-arch that extends away from the substrate. This single-arch configuration is not the only configuration, however, that is available to wire loop 20. For instance, FIG. 4 illustrates several different wire loop embodiments that may be used. Wire loop 80 has an intervening body portion that includes multiple arches or coils aligned horizontally next to each other, while wire loop 82 has multiple arches or coils vertically aligned or arranged. A single-arch wire loop 20 is also shown for purposes of illustration. FIG. 5 shows several other wire loop embodiments 86 and 88 that are similar in arrangement to the single-arch wire loop 20 of FIG. 3, except that they have different heights. It should be appreciated that the wire loops used in fluid flow sensor 12 may have any number of different features, shapes, sizes, configurations, arrangements, etc., including wire loops that have zig-zags, sinusoidal waves, square waves, etc. within the intervening body portion, as well as wire loops that extend away from substrate 24 or generally lie on a surface of the substrate, to cite a few possibilities. Wire loops 20 that extend away from substrate 24 may save valuable chip area and allow the formation of dense wire loop arrays, but it is also possible for the wire loops to lie along the substrate surface so that they are generally parallel with the substrate.

Figure 6:
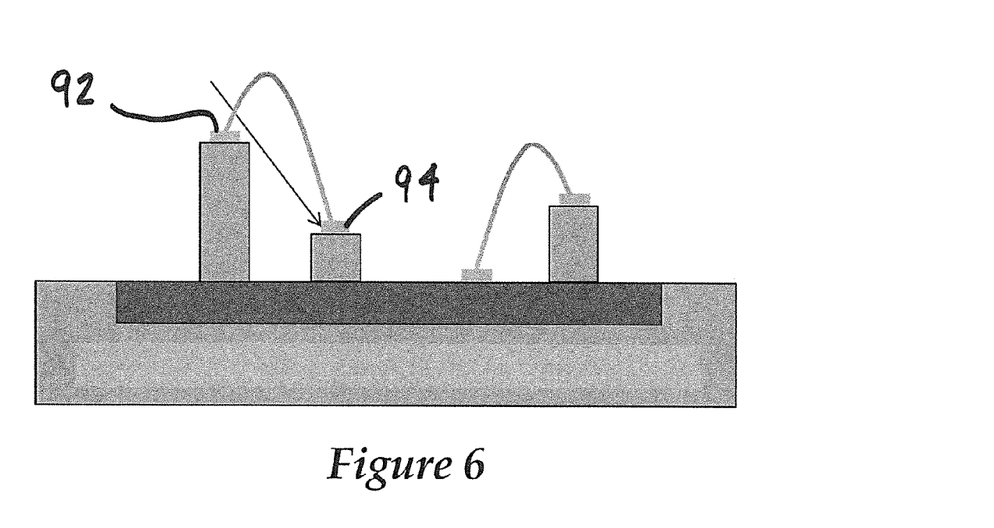
FIG. 6 is an enlarged, schematic cross-sectional view of different wire connection embodiments that may be used with a fluid flow sensor, such as the one shown in FIG. 3.

Wire connections 22 mechanically connect wire loops 20 to substrate 24 and, in some cases, electrically connect the wire loops to leads on the substrate or to each other. As with the wire loops, wire connections 22 may be provided according to a number of different embodiments. Some suitable materials for wire connections 22 include gold (Au), chromium (Cr), platinum (Pt), aluminum (Al), copper (Cu), tungsten (W), iridium (Ir), silver (Ag), paladium (Pd), silicon (Si), and/or alloys thereof. Wire connections 22 may include thin-film bonding pads, thick-film bonding pads, metal pins, tabs, foils or any other suitable connection types. Depending on the particular application and whether or not they are electroplated, for example, wire connections 22 may have a thickness from fractions of a µm to hundreds of µm. In one exemplary embodiment where wire connections 22 are specifically designed for use in a wire bonding process, each wire connection 22 is made from gold (Au) or a gold (Au) alloy material, has a thickness of about 0.1 µm-0.5 µm, and is directly deposited on a surface of substrate 24. This is not the only possibility, as the wire connections may be provided according to any number of different embodiments instead. In the illustrated examples of FIG. 6, for instance, wire connections 92 and 94 are elevated or are spaced from a surface of substrate 24 such that the wire ends connect with the substrate at offset positions that are not in the same plane as one another. It is possible for a wire loop to have first and second ends attached to the substrate at different elevated or offset positions (i.e., not in the same plane), as illustrated in FIG. 6, or to have first and second ends attached to the substrate at the same elevated position (i.e., in the same plane), not shown. As previously mentioned, wire connections 22 may include conductive epoxy or other adhesives, solder, or any other appropriate material instead of wire bonding pads. Wire loops 20 and wire connections 22 may be made from the same material or from different materials, depending on the application.

Substrate 24 acts as a foundation or support for wire loops 20 and provides structurally integrity to fluid flow sensor 12. It is also possible for substrate 24 to include embedded sensor circuitry for signal processing, analysis, control, readout, etc., although this is not required as the corresponding circuitry could reside at some other location, such as PCB or IC 52. In the example where substrate 24 is IC-compatible, embedded circuitry could be monolithically integrated into the substrate itself. Examples of such a substrate include an actual integrated circuit (IC) or a silicon-based substrate with CMOS or Bi-CMOS circuitry embedded therein, where the wire loops are directly wire bonded to the IC or IC substrate. In a different example where substrate 24 includes a PCB or a flexible circuit substrate, embedded circuitry could be provided in the form of discrete electronic components that are attached and connected to the PCB or the flexible circuit substrate. In either case, providing a substrate with embedded or included circuitry can be advantageous in that the "local" positioning of the wire loop(s) 20 just above the corresponding circuitry can potentially lower noise and enhance the accuracy or performance of the fluid flow sensor. It is also possible for a portion of the sensor circuitry to reside on substrate 24 and for a portion to reside on PCB or IC 52 or elsewhere. In the particular embodiment shown, substrate 24 is made from a glass- or silicon-based material, but any suitable electrically insulated substrate or substrate coated with an electrically insulated layer may be used. Furthermore, the wire loops 20 may pass directly over the circuitry in the substrate to minimize the substrate area occupied by the fluid flow sensor.

Figure 7:
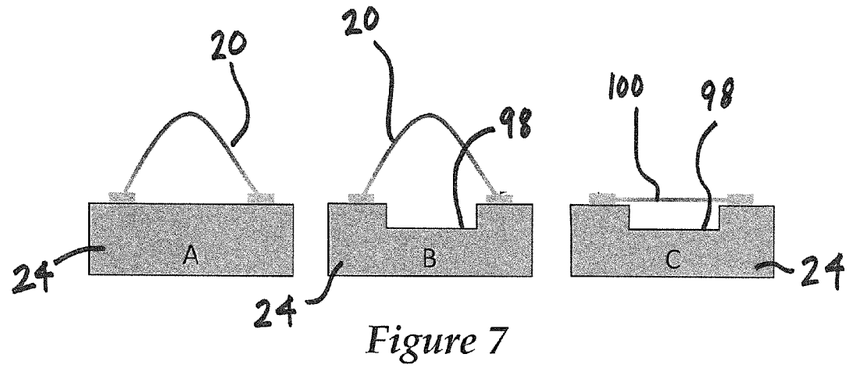
FIG. 7 is an enlarged, schematic cross-sectional view of different substrate embodiments that may be used with a fluid flow sensor, such as the one shown in FIG. 3.

In FIG. 3, substrate 24 is schematically shown as a flat base that includes a generally planar upper surface 96 to which the wire connections 22 are mounted and the wire loops 20 are attached. However, in a different embodiment illustrated in FIG. 7, there are shown several substrates that have non-planar upper surfaces 98. More specifically, substrate surface 98 includes an indentation or recess located between the two ends of wire loop 20 so that an additional space or volume is created beneath the wire loop. This type of configuration may promote fluid flow or other operational aspects that improve the performance of fluid flow sensor 12, and can enable certain arrangements such as that of FIG. 7(c) where wire loop 100 is straight and stretches across the recess in non-planar substrate surface 98, as opposed to extending away from the substrate. It should be recognized that other substrate configurations and embodiments are possible.

Figure 8:
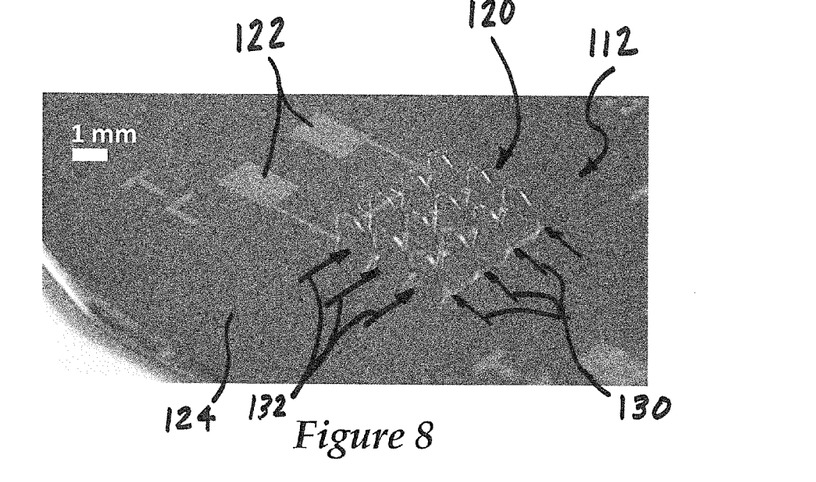
FIGS. 8 and 9 are perspective views of exemplary two-dimensional wire loop arrays in the shape of a grid that may be used with a fluid flow sensor, such as the one shown in FIG. 3.
Figure 9:
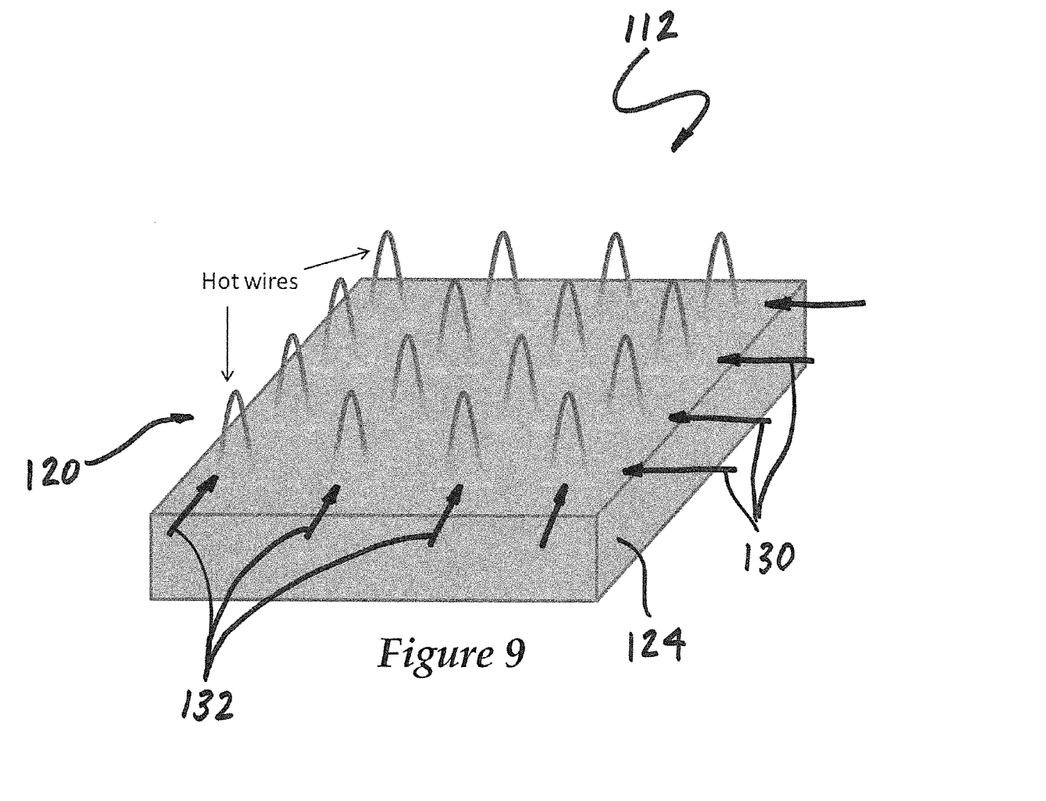
Figure 10:
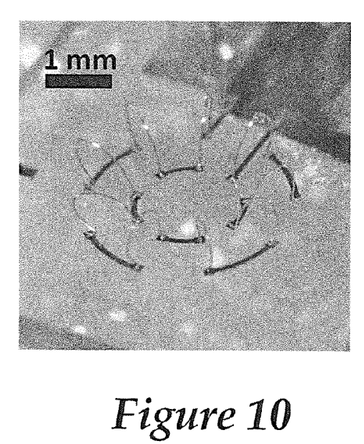
FIGS. 10-13 are perspective views of exemplary two-dimensional wire loop arrays in the shape of different patterns that may be used with a fluid flow sensor, such as the one shown in FIG. 3.
Figure 11:
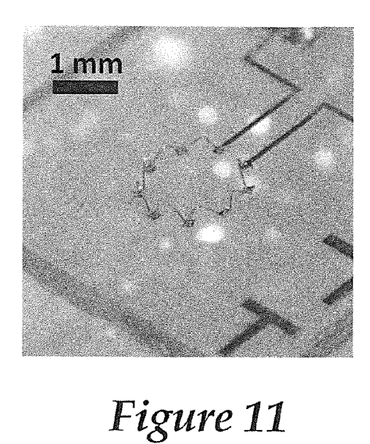
Figure 12:
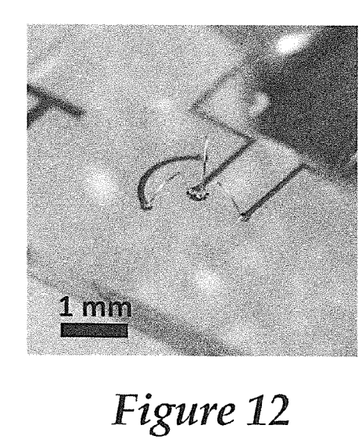
Figure 13:
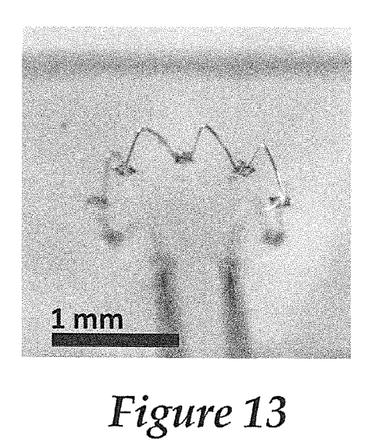

Before moving on to sensor circuitry 14, the embodiments shown in FIGS. 8-13 are described. Starting with the exemplary arrangement of FIGS. 8 and 9, fluid flow sensor 112 includes a two-dimensional array 120, one or more wire connections 122, and a substrate 124. Array 120 includes a number of individual wire loops arranged in a grid-like formation having both columns and rows 130, 132 (FIG. 8 shows a 4×3 array and FIG. 9 shows a 4×4 array), where the entire array is connected via wire connections or bond pads 122. This is a somewhat different arrangement than the one-dimensional array shown in FIGS. 2 and 3, which has three wire loops 20 aligned in a row. The two-dimensional array 120 offers more opportunity for thermal convection and, thus, potentially provides greater accuracy, sensitivity and/or directionality over traditional hot-wire anemometers. In the exemplary embodiment shown in FIG. 8, all of the wire loops of columns and rows 130, 132 are wired together so that they represent one electrical resistance or impedance across wire connections 122. However, if the loop columns and/or rows 130, 132 were wired separately or independently from one another, then the sensor readings from each block or group of loops could be separately analyzed. For example, if a row on a first side were to experience a greater or more rapid decrease in wire temperature than a row on a second side, then it may be reasonable to infer that the air is flowing in a direction that initially impinges or strikes the first side. This is an example of improved directionality, as such information is not always discernable from a single loop or one-dimensional loop array structure, and may be particularly useful in applications when the direction of fluid flow is unknown.

It should be appreciated that the fluid flow sensors described herein may include: a single wire loop (not shown), a one-dimensional array having a plurality of wire loops arranged in a line (e.g., FIGS. 2 and 3), a two-dimensional array having a plurality of wire loops arranged in columns and rows (e.g., FIGS. 8 and 9), a two-dimensional pattern having a plurality of wire loops arranged according to some pattern or other configuration (e.g., the star-shaped patterns in FIGS. 10 and 12, the circular patterns in FIGS. 11 and 13, etc.), or a three-dimensional loop array having a plurality of two-dimensional loop arrays stacked on top of each other (not shown). The use of multi-dimensional loop arrays or patterns, whether in grid-like or shaped pattern form, may enhance the ability of the fluid flow sensor in the areas of flow pattern monitoring, directional recognition, fault tolerance and averaging, to cite a few possibilities. Furthermore, the wire loops in a one- or multi-dimensional loop array may be made from different wire materials, could have different configurations (see FIG. 4), could have different heights or sizes (see FIGS. 5 and 6), or could extend away from or be aligned with the surface of the substrate (see FIG. 7), to cite several possibilities. For example, a single substrate could have multiple wire loops where different wire loops are made from different wire materials, have different configurations or sizes, and/or extend away from or are aligned with the substrate—all while being attached to the same substrate. A fluid flow sensor having any combination of the previously described wire loop embodiments or features may be used.

Figure 14:
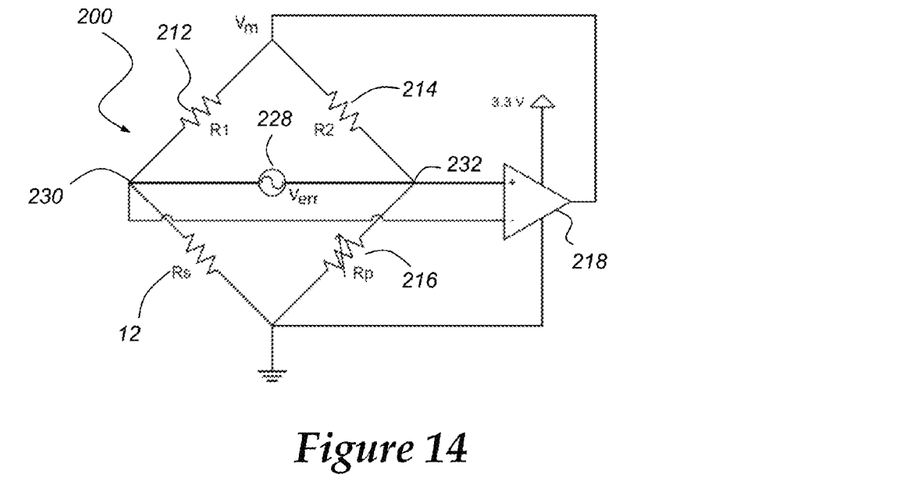
FIGS. 14 and 15, are schematic view of sensor circuitry that may be used with a fluid flow sensor, such as the one shown in FIG. 3.
Figure 15:
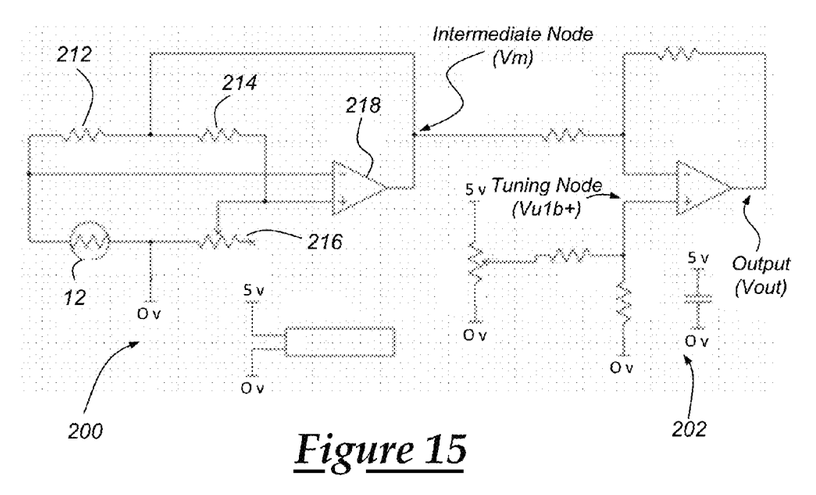

Sensor circuitry 14 may reside in whole or in part on substrate 24, PCB/IC 52 and/or some other suitable apparatus, and preferably include two stages, as illustrated in FIG. 15. The first stage 200 (bridge circuit) extracts the data from the fluid flow sensor, while the second stage 202 addresses bridge DC bias, rail-to-rail variation, etc. The circuits shown in FIGS. 14 and 15 are just two examples of circuits or portions of circuits that may be utilized by sensor circuitry 14; in this particular example, the circuits are arranged as a constant temperature anemometer (CTA), which is equivalent to constant sensor resistance, but the sensor circuitry is not limited to such an embodiment. The first stage circuit 200, which is shown in FIG. 14 in more detail, may be a bridge circuit and may include a pair of resistors 212, 214, the fluid flow sensor 12 (represented in FIG. 14 by resistor $R_s$), an adjustable resistor 216, and op-amp 218. Resistors 212 and 214 have identical resistances, while resistor $R_s$ varies according to fluid flow, as already explained. Adjustable resistor 216 is set to a desired operational resistance. An increase in fluid flow across wire loop(s) 20 reduces resistor $R_s$ due to the wire's thermal coefficient of resistance, which in turn reduces the voltage across resistor $R_s$. Op-amp 218 is arranged within a feedback loop that constantly adjusts its output current in order to zero the error voltage 228 (i.e., the difference between nodes 230 and 232) and keep the bridge balanced. Therefore, when the voltage across resistor $R_s$ is reduced due to fluid flow, the bridge current is increased by op-amp 218 in order to compensate for the heat loss until the bridge is brought to equilibrium which occurs when the error voltage 228 is zero. Due to this, the resistance of the wire and its temperature are generally kept constant. The error voltage 228 across the bridge is proportional to fluid flow and can therefore be measured and compared with characterizations of the sensor to make accurate fluid flow velocity measurements. Thus, the bridge voltage or output is proportional to the fluid flow. As is appreciated by those skilled in the art, the function of the first stage circuit 200 could be achieved in multiple ways, and is certainly not limited to the specific embodiment shown here.

The second stage 202 of the sensor circuitry may be used to null the bridge DC bias and to scale the bridge voltage into rail-to-rail variation at the output. It should be appreciated that second stage circuit 202 may be used to provide any number of signal processing, conditioning, analyzing and/or evaluating steps, and is certainly not limited to the specific embodiment shown here.

During operation, fluid flow sensor 12 estimates one or more fluid flow parameters, such as fluid speed, by using heat transfer through convection from the wire loop(s) 20, whose temperature is purposely elevated from the ambient temperature. The amount of transferred heat is directly proportional to the viscosity, density and/or speed of the fluid by which thermal energy is sunk or wicked away from the wire loops (i.e., the hot-wire). If the fluid viscosity and density are known, then the fluid speed can be readily sensed. In this setup, the temperature of the wire loops is maintained at a constant value and the amount of power supplied to fluid flow sensor 12 in order to compensate for the heat loss is measured. The output voltage of the sensor has reverse behavior, meaning that for high fluid flows, a lower output voltage is observed. The constant temperature anemometer (CTA) operation may allow for a more stable sensor and a greater detectable flow range with less power consumption than a constant current anemometer (CCA). The bridge voltage of sensor circuitry 14 is the output signal and may be used as the voltage supply for analysis or evaluation. Fluid flow sensor 12 may be able to detect fluid flow levels (including very small fluid flows), fluid flow direction, fluid flow sources (e.g., open window or door, or motion by a nearby person), distance to a known fluid flow source, and/or motion of a robot or other vehicle to which the sensor is attached through fluid flow changes, to cite several possibilities. Moreover, the exemplary fluid flow sensor may be able to accomplish the preceding tasks while being low weight (e.g., less than 2.5 g) and using very little power (e.g., less than 100 mW). It is also possible to measure fluid type by using wires that are coated with other sensitive materials, such as polymers that respond differently to different fluids.

During manufacture, fluid flow sensor 12 may be fabricated using a micro-scale wire bonding technique in which the bond wires (e.g., wire loops 20) are fabricated by wire bonders that are routinely used in integrated circuit (IC) packaging. As already mentioned, the wire loops 20 are manufactured from "pre-formed" wire, which can include any wire, ribbon, tape or other interconnect that is already in a stand-alone or three-dimensional state when it is attached to the substrate; this could include pre-formed wires provided from a spool or other source. Wire bonding enables fluid flow sensor 12 to have a dense wire loop array, to be compatible with most complementary metal-oxide semiconductor (CMOS) or Bi-CMOS circuitry, and to be formed in an economical manner. The fluid flow sensor may be CMOS/Bi- CMOS/IC compatible because wire loop 20, which acts as the sensing element, is formed through standard, high-throughput wire bonding typically performed in IC packaging. This is different than the wire-type anemometers described above which use meso-scale assembly performed by hand or other slow serial processes, or the film-type anemometers where the sensing element is monolithically integrated as part of a batch fabrication process. According to one potential embodiment, the fluid flow sensor is fabricated by wire bonding platinum (Pt) or aluminum (Al) wires with a wedge wire bonder over chromium (Cr)/gold (Au) thin film wire connections on a CMOS wafer made of glass or silicon. It is also possible to form the wire loop using techniques other than wire bonding, for example by using micro-welding or other techniques through which a wire loop can be formed and attached to the substrate.

Figure 16:
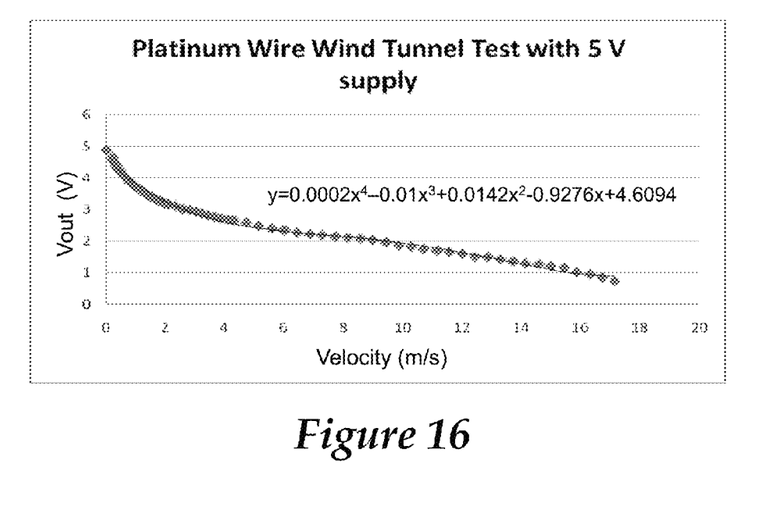
FIGS. 16-25 are graphs of different test results for an exemplary embodiment of a fluid flow sensor that was tested through the use of wind tunnel testing and a rate table.
Figure 17:
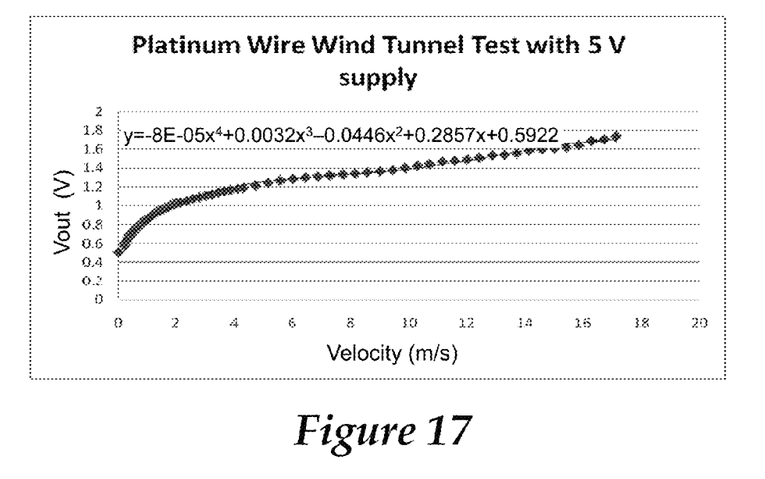
Figure 18:
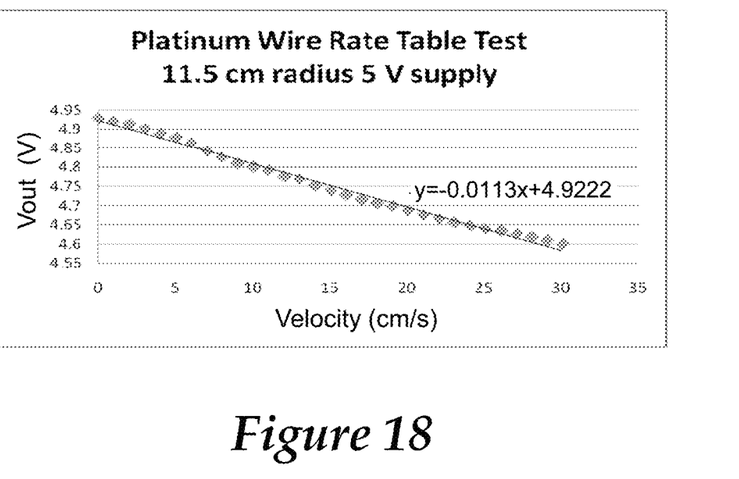
Figure 19:
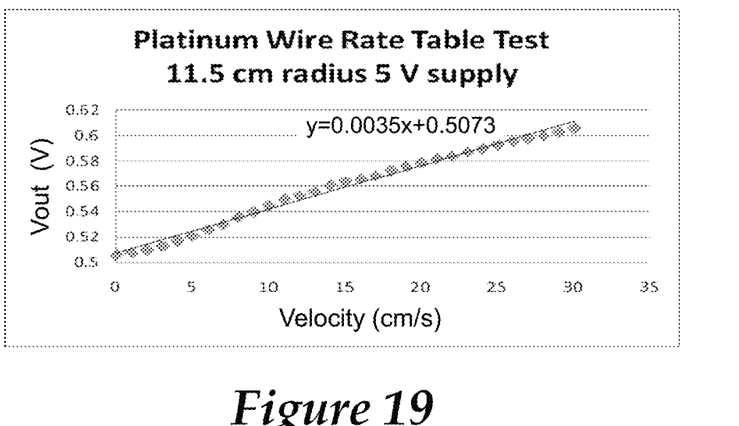
Figure 20:
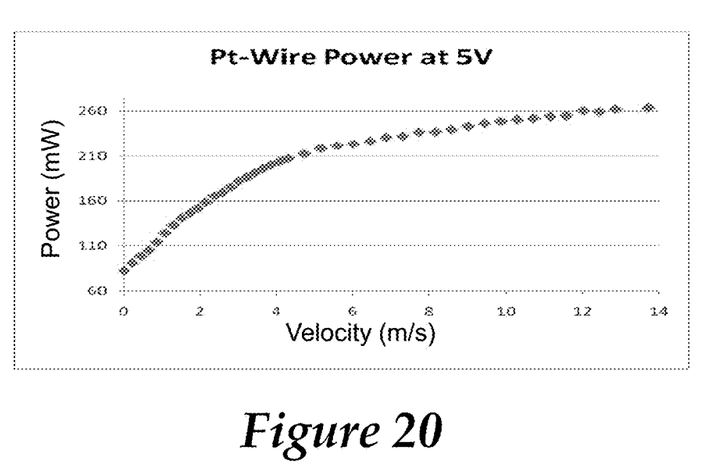
Figure 21:
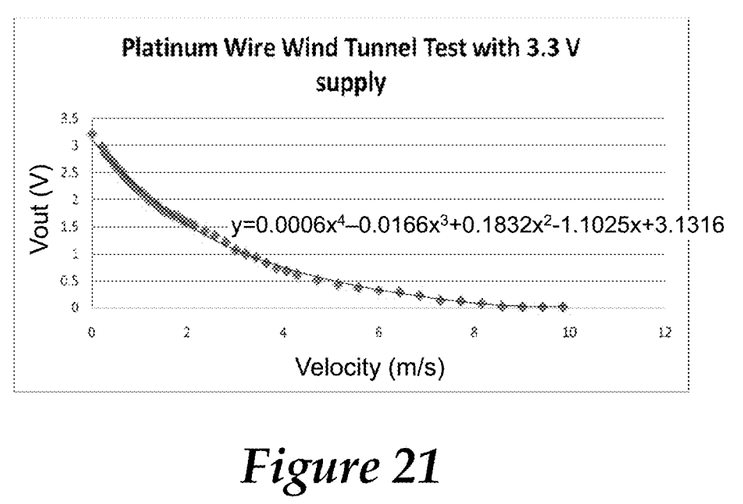
Figure 22:
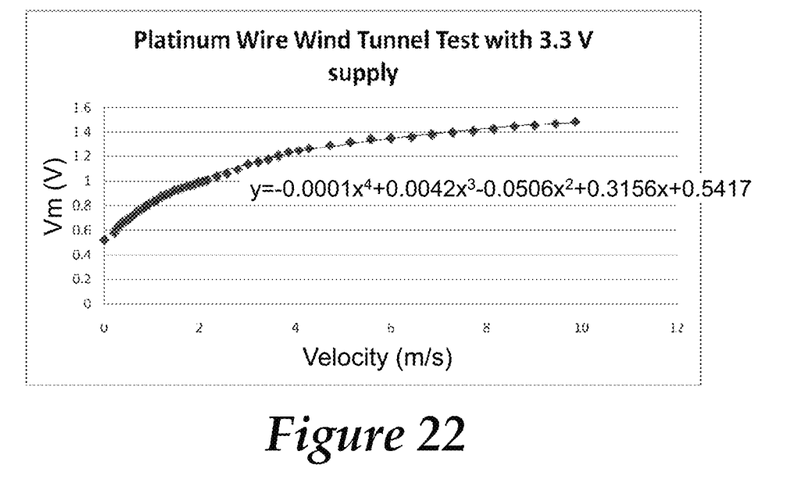
Figure 23:
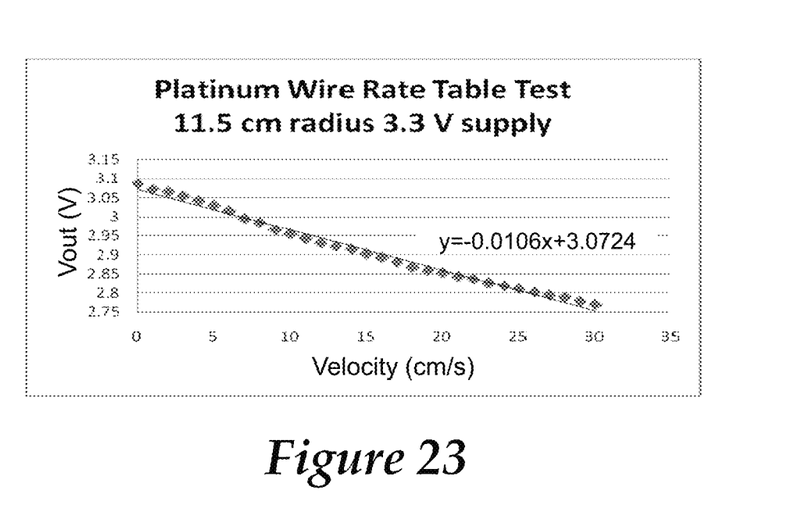
Figure 24:
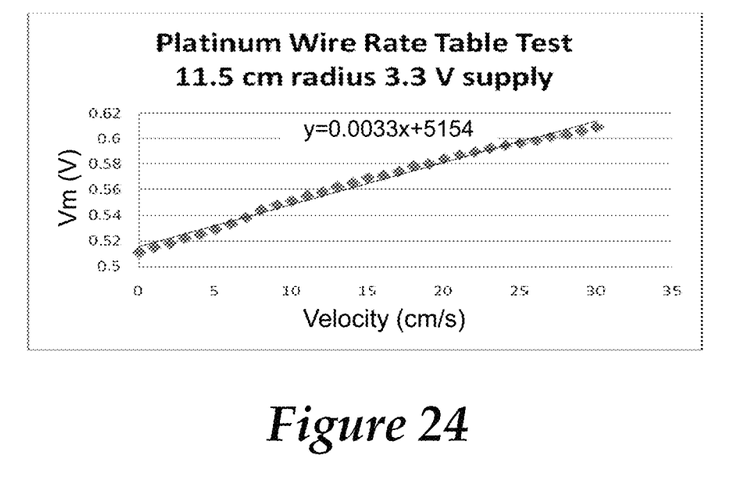
Figure 25:
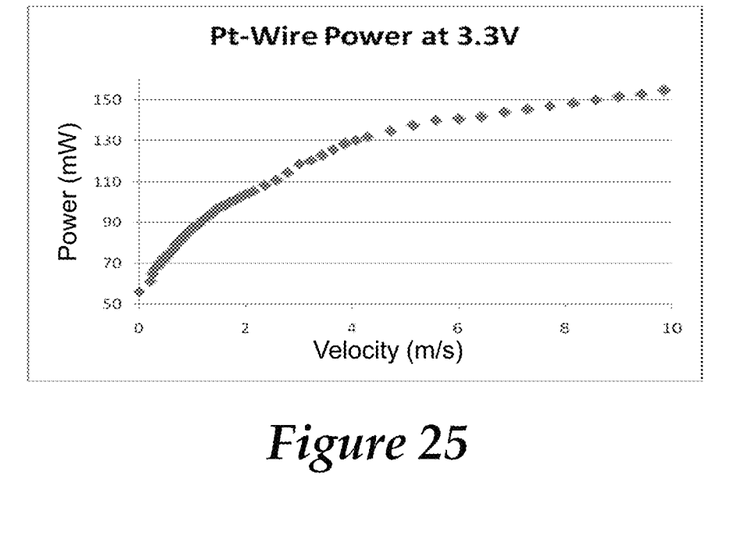

One or more embodiments of the fluid flow sensor have been tested and characterized through wind tunnel testing. Characterizations were also conducted using a rate table, which moved the sensor through stagnant air at constant velocity, to achieve accurate data for velocities from 0-30 cm/s. During these tests the output voltage ($V_{out}$) and the intermediate node voltage ($V_m$) are monitored; $V_m$ is the voltage of the first stage of the circuit immediately after the sensing wire, whereas $V_{out}$ is the voltage of the second stage or the amplified signal with the DC bias removed. During sensor operation the value of $V_m$ increases and $V_{out}$ decreases with increasing flow velocity. The resulting data from tests performed using the rate table at low velocities with a 5.0V and a 3.3V supply voltage can be viewed as follows: FIG. 16—measured $V_{out}$ with 5.0V supply; FIG. 17—measured $V_m$ with 5.0V supply; FIG. 18—measured $V_{out}$ at low flow velocities with 5.0V supply; FIG. 19—measured $V_m$ at low flow velocities with 5.0V supply; FIG. 20—power consumed with 5.0V supply; FIG. 21—measured $V_{out}$ with 3.3V supply; FIG. 22—measured $V_m$ with 3.3V supply; FIG. 23—measured $V_{out}$ at low flow velocities with 3.3V supply; FIG. 24—measured $V_m$ at low flow velocities with 3.3V supply; and FIG. 25—power consumed with 3.3V supply. There is a close correlation between the data gathered from wind tunnel testing and rate table testing. The range of the sensor when powered by a 5.0V supply is approximately 2.5 cm/s-~17 m/s. At the reduced supply voltage of 3.3V, the sensor consumes less power but the maximum detectable fluid flow is reduced 9 m/s. Similar data have been taken for the aluminum wire-based sensors, but are not presented here for the sake of brevity. As previously mentioned, wire loops or sensing elements made from wire materials other than aluminum or platinum may also be used.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A fluid flow sensor, comprising:
a substrate;
at least one wire connection mounted on the substrate; and
at least one wire loop attached to the substrate via the wire connection, wherein the wire loop is made from a pre-formed wire that is non-monolithically attached to the substrate as a sensing element.

2. The fluid flow sensor of claim 1, wherein the wire loop includes at least one wire material selected from the group consisting of: platinum (Pt), aluminum (Al), gold (Au), tungsten (W), iridium (Ir), copper (Cu), silver (Ag), paladium (Pd), silicon (Si), chromium (Cr), or an alloy thereof.

3. The fluid flow sensor of claim 1, wherein the wire loop has a diameter from about 1 μm to 500 μm and a length from about 0.5 mm to 200 mm.

4. The fluid flow sensor of claim 1, wherein the wire loop is a pre-formed wire and includes at least one end that is wire bonded to the substrate via a bonding pad located on a surface of the substrate.

5. The fluid flow sensor of claim 1, wherein the wire loop is a pre-formed wire and includes at least one end that is micro-welded to the substrate via a weld located on a surface of the substrate.

6. The fluid flow sensor of claim 1, wherein the wire loop is a pre-formed wire and includes a first end attached to the substrate, a second end attached to the substrate, and an intervening body portion that extends between the first and second ends and extends away from a surface of the substrate.

7. The fluid flow sensor of claim 6, wherein the intervening body portion includes a single arch located between the first and second ends.

8. The fluid flow sensor of claim 6, wherein the intervening body portion includes a plurality of coils or bent sections located between the first and second ends.

9. The fluid flow sensor of claim 1, wherein at least one wire connection is elevated or spaced from a surface of the substrate so that the wire loop is mounted on the substrate at an elevated or offset position.

10. The fluid flow sensor of claim 1, wherein the substrate is made from a semiconducting material and includes embedded circuitry that is monolithically integrated into the substrate.

11. The fluid flow sensor of claim 1, wherein the substrate is a printed circuit board (PCB) or a flex board and includes embedded circuitry that is attached to a surface of the substrate.

12. The fluid flow sensor of claim 1, wherein the substrate includes a generally planar surface to which first and second ends of the wire loop are attached.

13. The fluid flow sensor of claim 1, wherein the substrate includes a generally non-planar surface to which first and second ends of the wire loop are attached, and the non-planar surface includes a recess located between the first and second ends so that the wire loop extends over the recess.

14. The fluid flow sensor of claim 1, comprising a single wire loop that is attached to and extends away from the substrate.

15. The fluid flow sensor of claim 1, comprising a plurality of wire loops, wherein at least one wire loop differs from another wire loop in terms of its shape, height, or wire material so that different types of wire loops are attached to the same substrate.

16. The fluid flow sensor of claim 1, comprising a plurality of wire loops arranged in a one-dimensional array, wherein the wire loops are generally aligned in a line.

17. The fluid flow sensor of claim 1, comprising a plurality of wire loops arranged in a two-dimensional array or pattern.

18. The fluid flow sensor of claim 17, wherein the two-dimensional array or pattern is generally configured according to a grid-like formation that includes columns and rows.

19. The fluid flow sensor of claim 17, wherein the two-dimensional array or pattern is generally configured according to a star- or circular-shaped pattern.

20. A sensor assembly, comprising:
   the fluid flow sensor of claim 1;
   sensor circuitry electrically connected to the fluid flow sensor; and
   a housing at least partially surrounding the sensor circuitry, wherein the fluid flow sensor provides sensor output to the sensor circuitry.

21. A fluid flow sensor, comprising:
   a substrate having embedded sensor circuitry;
   at least one wire connection mounted on the substrate; and
   at least one wire loop wire bonded to the substrate via the wire connection, wherein the wire loop is a pre-formed bond wire that is wire bonded to the substrate so that it extends away from the substrate and acts as a sensing element.

22. The fluid flow sensor of claim 21, wherein the substrate with the embedded sensor circuitry is either an integrated circuit (IC) or an IC substrate and the wire loop is directly wire bonded to the IC or the IC substrate.

23. The fluid flow sensor of claim 21, wherein the substrate with the embedded sensor circuitry is either a printed circuit board (PCB) or a flexible circuit substrate and the wire loop is directly wire bonded to the PCB or the flexible circuit substrate.

24. A method of manufacturing a fluid flow sensor, comprising the steps of:
   (a) providing a substrate;
   (b) providing at least one pre-formed wire; and
   (c) attaching the pre-formed wire to the substrate using a non-monolithic forming process, wherein the pre-formed wire is attached as a wire loop that acts as a sensor element.

25. The method of claim 24, wherein step (c) further comprises wire bonding the pre-formed wire to the substrate via a wire bonding process.

26. The method of claim 24, wherein step (c) further comprises micro-welding the pre-formed wire to the substrate via a micro-welding process.

* * * * *